United States Patent [19]
Aoki

[11] Patent Number: 6,117,481
[45] Date of Patent: Sep. 12, 2000

[54] MANUFACTURING METHOD FOR ELECTRONIC DEVICES

[75] Inventor: Masaru Aoki, Tokyo, Japan

[73] Assignee: Mitsubishi Denki Kabushiki Kaisha, Tokyo, Japan

[21] Appl. No.: 09/200,738

[22] Filed: Nov. 30, 1998

[30] Foreign Application Priority Data

Jun. 12, 1998 [JP] Japan ................................. 10-165347

[51] Int. Cl.$^7$ ................................. B05D 3/14; B05D 5/12
[52] U.S. Cl. ................................. 427/8; 427/58; 427/240; 427/346; 427/385.5
[58] Field of Search ........................... 427/240, 8, 385.5, 427/458, 346

[56] References Cited

U.S. PATENT DOCUMENTS

| | | | |
|---|---|---|---|
| 5,489,337 | 2/1996 | Nomura et al. | 118/667 |
| 5,912,054 | 6/1999 | Tateyuma | 427/425 |

FOREIGN PATENT DOCUMENTS

| | | |
|---|---|---|
| 4-305651 | 10/1992 | Japan . |
| 6-151296 | 5/1994 | Japan . |
| 9-164357 | 6/1997 | Japan . |

Primary Examiner—Janyce Bell
Attorney, Agent, or Firm—Oblon, Spivak, McClelland, Maier & Neustadt, P.C.

[57] ABSTRACT

A manufacturing method for electronic devices including applying photosensitive or non-photosensitive resin onto a substrate by a slit-type dropping nozzle method. A slit-type dropping nozzle for performing resin application is scanned to apply resin while maintaining a scanning direction of the nozzle in an inclined condition relative to the substrate at a specified angle in substantially a same direction as a rotating direction of the substrate after resin has been applied thereto. With the above method, even in a case in which clogging of a part of the nozzle due to foreign matter and dropping defects have occurred, the uniformity in film thickness typically will not be affected unless the defect has occurred in the center of the substrate.

10 Claims, 11 Drawing Sheets

MANUFACTURING METHOD FOR ELECTRONIC DEVICES

BACKGROUND OF THE INVENTION

1. Field of the Invention

The present invention relates to a manufacturing method for electronic devices with which uniform application of photosensitive or non-photosensitive resin such as resist onto a substrate is enabled during manufacturing processes of electronic devices such as liquid crystal display devices employing semiconductor devices.

2. Discussion of the Background

An explanation will be given based on a case in which patterns for liquid crystal display elements employing TFT (thin film transistor) are formed by utilizing a stepper exposure device. A photo-resist having photosensitive characteristics is uniformly applied onto a glass substrate on which there is formed a metal thin film or dielectric thin film. Onto this substrate, patterns formed as masks are subsequently treated by projecting and exposing by a stepper, and patterns for display elements are exposed and transferred onto the photo-resist. The exposed and transferred patterns further undergo developing, etching and resist exfoliating. By repeating the same processes several times, a wiring pattern, an insulating film pattern, and a semiconductor layer pattern are laminated to form display elements. Such a conventional art is also disclosed in the column of "Prior Art" of Japanese Unexamined Patent Publication No. 305651/1992. The resist application process is also disclosed in "The Sixth Fine Process Technologer/Japan '96 Seminar Resume: Manufacturing Device Course (R6) Latest Tendencies in Photo-processing Technology", Pages 3 to 21. FIGS. 7 and 8 are diagrams showing a series of processes of film forming, resist applying, exposing, developing, etching and resist exfoliating. In the drawings, 100 denotes a substrate, 101 a thin film such as metal film or insulating film formed on the substrate, 102 photosensitive resin such as resist, 103 a mask, and 104 a pattern portion of the mask 103, respectively. FIG. 9 is a diagram showing application processes through central dropping and rotation (uniformization) of resin which is one method for the resin application process. In the drawings, 110 denotes a substrate, 111 a nozzle for dropping resin, and 112 photosensitive or non-photosensitive resin such as resist, respectively. FIG. 10 is a diagram showing application processes, i.e. slit nozzle dropping, completion of dropping, and rotation (uniformization) of resin which is another method for the resist application process. In the drawings, 120 denotes a substrate, 121 a slit-type nozzle for dropping resin, and 122 photosensitive or non-photosensitive resin such as resist, respectively.

The prior art process will now be explained. As shown in FIG. 7, the thin film 101 such as metal film or insulating film is formed onto the substrate 100 by using a CVD device or spattering device (FIG. 7(b)). Then, the photosensitive resin 102 such as positive resist is applied onto the substrate 100 by rotational application (FIG. 7(c)). Exposing of the substrate 100 applied with resist is performed by employing, for example, a stepper. At this time, the shutter of the stepper is released for several seconds until an appropriate light exposure for the resist is reached for the exposure, the resist is exposed, and the pattern is transferred onto the substrate 100 as a resist photosensitive image (FIG. 7(d)). After completion of exposing, the substrate 100 is treated with a developer for developing and the photosensitive image of the transferred mask pattern is formed on the substrate 100 as a resist image, as shown in FIG. 8(a). Then, etching of the formed thin film 101 is performed (FIG. 8(b)), and the resist 102 is exfoliated thereafter (FIG. 8(c)). By repeating these processes several times, a wiring pattern, an insulating film pattern and a semiconductor layer pattern are laminated to form display elements.

A prior art resist application method will now be explained. The central dropping method which is a general resist application method will be explained. As shown in FIG. 9, photosensitive or non-photosensitive resin 112 such as resist is dropped by a specified amount through the nozzle 111 from centrally above the substrate 110, and after the resin has naturally spread after a specified time has elapsed, the substrate is rotated to make the resin spread uniformly over the whole substrate in order to perform application. Another resist application method, i.e. the slit dropping method will be explained. As shown in FIG. 10, photosensitive or non-photosensitive resin 122 such as resist is dropped and applied uniformly and over the whole substrate by making the slit nozzle 121 scan along the substrate 120 in a parallel manner, and the substrate is rotated thereafter to further improve the uniformity of the applied film thickness. If the targeted uniformity of film thickness can be obtained by the slit application alone, the following rotating process might be omitted.

According to prior art manufacturing methods, in the case where resin is applied by employing the central dropping method, resin needs to be dropped onto the substrate in an amount that is sufficient for self-spreading and spreading over the whole substrate by the following rotating process, and the ratio of the amount of resin finally applied onto the substrate to that of initially dropped resin will reach approximately 1:97 to 99, thereby presenting a drawback that the efficiency of effective usage is low. On the other hand, in the case where resin is to be applied by the slit dropping method, the amount of resin to be dropped onto the substrate will be approximately 1/10 to 1/3 of that of the central dropping method. However, when the amount of droppings is decreased or clogging due to foreign matters or hardened resin in the slit nozzle has occurred, there might be generated broken portions 133 (irregular (shortage) regions of droppings) of the resin 132 in the scanning direction as shown in FIGS. 11(a) and (b) in applying photosensitive or non-photosensitive resin 132 such as resist by scanning the slit-like nozzle 131 over the substrate 130. Especially in cases in which such broken portions are generated at a central portion (center of rotation) of the substrate, extending substantially in a radial manner from the center of the substrate in directions of the centrifugal force, inertial force and frictional force (between substrate and resin), it became difficult to ensure uniformity of applied film thickness by the following rotation of the substrate, depending on the amount (degree) of shortage of the droppings.

When photosensitive resin is employed and the applied film thickness becomes irregular, excess/shortage of appropriate exposing energy occurs between the irregular portions and peripheral normal portions, which might lead to pattern defects. In case non-photosensitive resin is employed, irregularities in required characteristics such as irregularities in capacitance formed by the film thickness or irregularities in transmittance, which are objects of the film itself have occurred, and thus caused inconveniences to result in deficiencies.

It is an object of the present invention to provide a manufacturing method for electron devices with which a desired film thickness of favorable uniformity can be secured, generation of pattern defects be decreased, and stable quality be obtained.

SUMMARY OF THE INVENTION

The manufacturing method for electron devices according to a first aspect of the present invention is a manufacturing method for electron devices including an application process of applying photosensitive or non-photosensitive resin onto a substrate by a slit dropping method, characterized in that a slit-type dropping nozzle for performing resin dropping is scanned to apply resin while maintaining a scanning direction of the nozzle in an inclined condition relative to the substrate at a specified angle in a direction identical with a rotating direction of the substrate after resin has been dropped and applied.

The manufacturing method for electron devices according to a second aspect of the present invention is a manufacturing method for electron devices including an application process of applying photosensitive or non-photosensitive resin onto a substrate by a slit dropping method, characterized in that a scanning direction of a slit-type dropping nozzle for performing resin dropping is set by making the substrate oscillate and rotate around a certain position at a specified period and oscillating angle so that the nozzle is relatively meandered and scanned with respect to the substrate to apply resin.

The manufacturing method for electron devices according to a third aspect of the present invention is a manufacturing method for electron devices including an application process of applying photosensitive or non-photosensitive resin onto a substrate by a slit dropping method, characterized in that at the time of scanning a slit-type dropping nozzle for performing resin dropping, the nozzle intermittently drops resin in a scanning direction except onto a central portion of the substrate to apply resin.

The manufacturing method for electron devices according to a fourth aspect of the present invention is a manufacturing method for electron devices recited in the preceding first or second aspect of the present invention, characterized in that at the time of scanning the slit-type dropping nozzle, the method includes a process wherein the nozzle intermittently drops resin in a scanning direction to apply resin.

The slit-type dropping nozzle according to a fifth aspect of the present invention is characterized in that comb teeth-like outlets are formed at a slit-type dropping nozzle for performing resin dropping employed in an application process of applying photosensitive or non-photosensitive resin onto a substrate by a slit-type dropping method so that resin can be intermittently dropped in a width direction of the nozzle.

The manufacturing method for electron devices according to a sixth aspect of the present invention is a manufacturing method for electron devices recited in the preceding first, second or third aspect of the present invention, characterized in that the slit-type dropping nozzle according to the fifth aspect of the present invention is employed for intermittently dropping resin with respect to a scanning width and a scanning direction except onto a central portion of the substrate to apply resin.

The manufacturing method for electron devices according to a seventh aspect of the present invention is a manufacturing method including an application process of applying photosensitive or non-photosensitive resin onto a substrate by slit dropping method or central dropping method, characterized in that the substrate is either rotated after dropping, or maintained as it is and oscillated after performing application to improve uniformity of applied film thickness.

The manufacturing method for electron devices according to an eighth aspect of the present invention is the manufacturing method for electron devices recited in the preceding first, second or third aspect of the present invention, including an application process of applying photosensitive or non-photosensitive resin onto a substrate by slit dropping method or central dropping method, characterized in that the substrate is either rotated after dropping, or maintained as it is and oscillated after performing application to improve uniformity and flatness of applied film thickness.

The manufacturing method for electron devices according to a ninth aspect of the present invention is a manufacturing method for electron devices including an application process of applying photosensitive or non-photosensitive resin onto a substrate by slit dropping method, characterized in that resin is applied such that a plurality times of scanning of a slit-type dropping nozzle for performing resin dropping is performed in accordance with a desired film thickness.

The manufacturing method for electron devices according to a tenth aspect of the present invention is a manufacturing method for electron devices recited in the preceding first, second, third or seventh aspects of the present invention including an application process of applying photosensitive or non-photosensitive resin onto a substrate by slit dropping method, characterized in that resin is applied such that a plurality times of scanning of a slit-type dropping nozzle for performing resin dropping is performed in accordance with a desired film thickness.

According to the first and second aspects of the present invention, in employing the slit dropping method, even when irregular portions in applied film thickness are generated on the substrate in which resin has been dropped onto the substrate so that shortage of resin has occurred at a part of a width direction of the droppings, occurrence of degradations in pattern characteristics can be decreased by devising a relative scanning direction of the slit-type dropping nozzle with respect to the substrate in the following rotation of the substrate such that uniformity of film thickness can be secured.

According to the third, fourth, fifth and sixth aspects of the present invention, by making the dropping of resin from the slit-type dropping nozzle to be intermittent, the amount of droppings can be further decreased, and uniformity of applied film thickness can be secured.

According to the seventh and eighth aspects of the present invention, by applying oscillation of specified period and amplitude to the substrate after slit dropping or rotating the substrate, the uniformity and flatness of film thickness can be further improved.

According to the ninth and tenth aspects of the present invention, in case of providing an applied thin film of which thickness exceeds a film thickness limit of resin, in addition to the above manufacturing methods of the preceding first, third and seventh aspect of the present invention, the method is further repeated for several times to make the desired film thickness be uniform and the efficiency of utilization of resin to be high.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
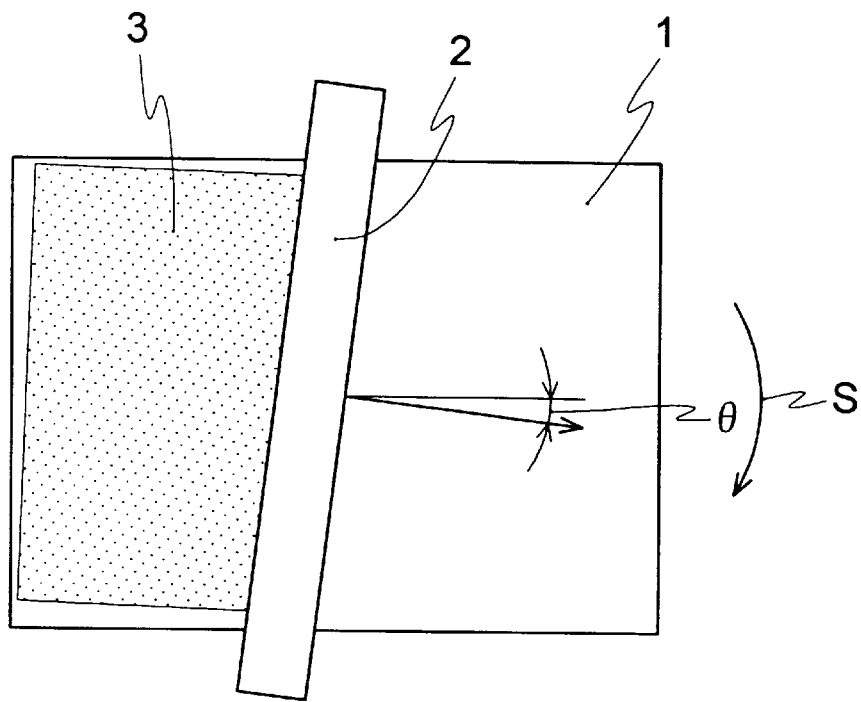
FIG. 1(a) and (b) is a diagram for explaining application of resin according to one embodiment of the present invention.

Referring now to the drawings, wherein like reference numerals designate identical or corresponding parts throughout the several views, and more particularly to FIGS. 1 to 6 thereof, there are illustrated embodiments of the present invention as will be further described.

Embodiment 1

Figure 1B:
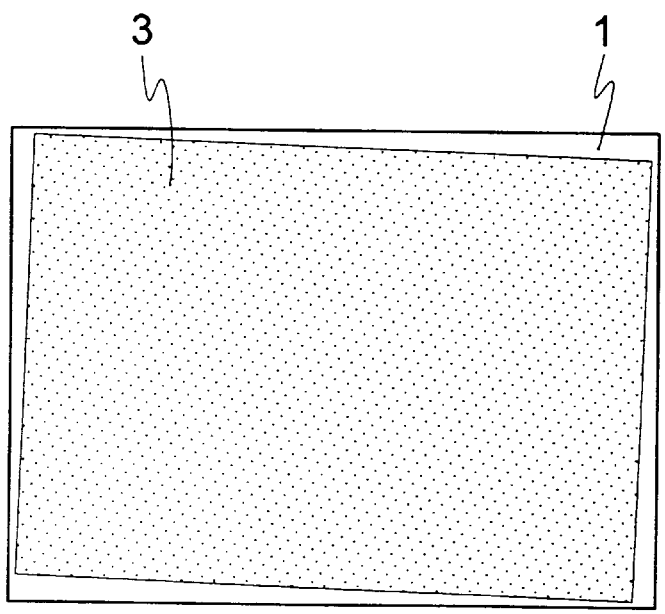

A manufacturing method of electron devices according to an embodiment of the present invention will now be explained. FIG. 1 is a diagram for explaining application of resin according to an embodiment of the present invention, wherein FIG. 1(a) is a diagram showing a condition in which a slit-type dropping nozzle is performing scanning while dropping resin, and FIG. 1(b) is a diagram showing a condition after the slit-type dropping nozzle has completed dropping resin. In the drawings, 1 denotes a substrate, 2 a slit-type dropping nozzle (hereinafter simply referred to as "nozzle"), and 3 a photosensitive positive-resist (hereinafter simply referred to as "resist") applied onto the substrate 1.

As shown in FIG. 1(a), the nozzle 2 is scanned while resist 3 is being dropped by the nozzle 2 onto the substrate 1. At this time, the scanning direction of the nozzle 2 which performs resin dropping is not set to be parallel relative to the substrate 1 but to maintain a specified angle θ in a direction identical with a rotating direction S of the substrate after dropping. The substrate 1 is then fixed at this inclined condition, e.g. at a position at which the substrate 1 is rotated approximately 1 to 15 degrees and the nozzle 2 is scanned to apply resin. By setting the direction of inclination to be identical with the rotating direction of the substrate after completion of resin dropping, the effect of improving the uniformity of applied film thickness can be made large. It should be noted that since the nozzle 2 is scanned in an oblique direction relative to the substrate 1, it is preferable that discharge outlets for resin dropping provided at both end portions of the nozzle 2 are provided with dropping adjusting means for regulating excessive amount of droppings along an edge of the substrate 1.

According to this embodiment, the scanning direction of the nozzle 2 for performing resin dropping is not set to be parallel relative to the substrate 1 but is maintained in a fixed condition at a position rotated in a direction identical with the rotating direction of the substrate after dropping, e.g. it is rotated by approximately 1 to 15 degrees to perform scanning and application of resin. With this arrangement, even in a case in which clogging of a part of the nozzle 2 has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods without the necessity of increasing the amount of droppings of resist used at the time of application.

Embodiment 2

Figure 2A:
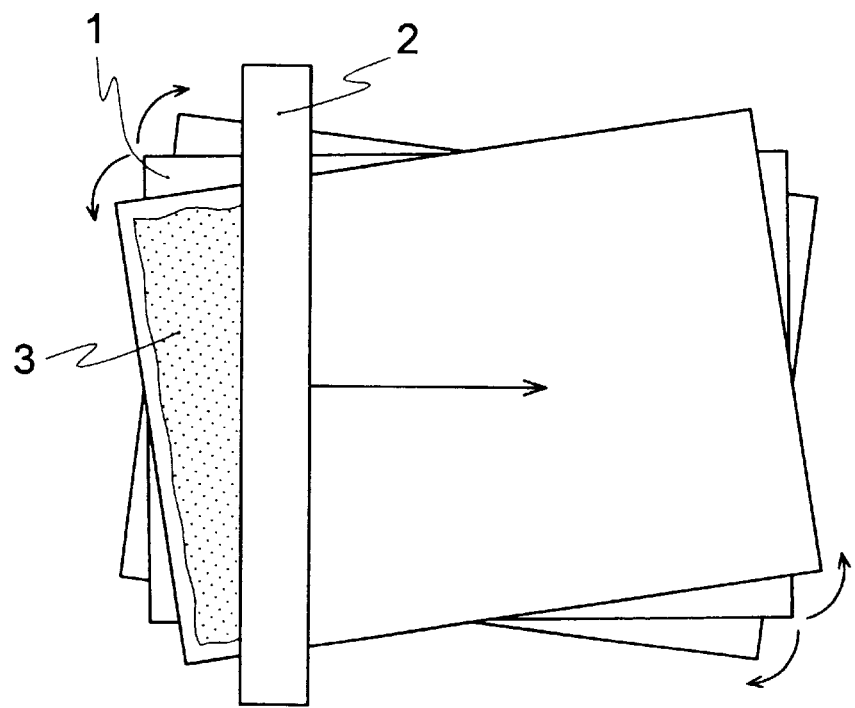
FIG. 2(a) and (b) is a diagram for explaining application of resin according to another embodiment of the present invention.
Figure 2B:
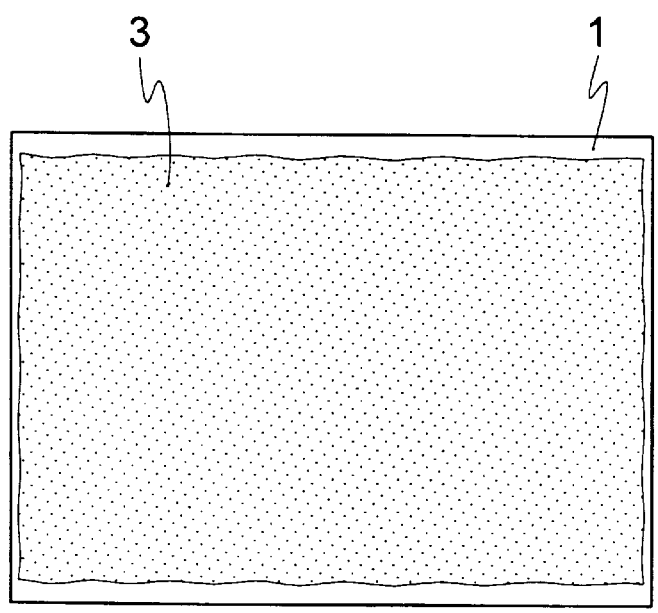

A manufacturing method of electron devices according to a second embodiment of the present invention will now be explained. FIG. 2 is a diagram for explaining application of resin according to another embodiment of the present invention, wherein FIG. 2(a) is a diagram showing a condition in which a nozzle 2 is performing scanning while dropping resin, and FIG. 2(b) is a diagram showing a condition after the nozzle 2 has completed dropping resin. In the drawings, 1 denotes a substrate, 2 a nozzle, and 3 resist applied onto the substrate 1.

As shown in FIG. 2(a), the nozzle 2 is scanned while resist 3 is being dropped by the nozzle 2 onto the substrate 1. At this time, the scanning direction of the nozzle 2 is made to be meander relative to the substrate 1. Scanning is performed by making a substrate stage (not shown) to oscillate and rotate, e.g. such that the substrate 1 is inclined at a specified period and oscillating angle around a relatively parallel position. Such period and oscillating angle of the oscillating rotation might be set to 0.5 to 5.0 seconds and approximately ±1 to 5 degrees, respectively.

According to this embodiment, by making the substrate 1 rotate in an oscillating manner with respect to the scanning direction of the nozzle 2, resin is made to drop while the scanning direction of the nozzle 2 is made to meander relative to the substrate 1. With this arrangement, even in a case in which clogging of a part of the nozzle 2 has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be further reduced than compared to conventional methods without the necessity of increasing the amount of droppings of resist used at the time of application.

Embodiment 3

Figure 3A:
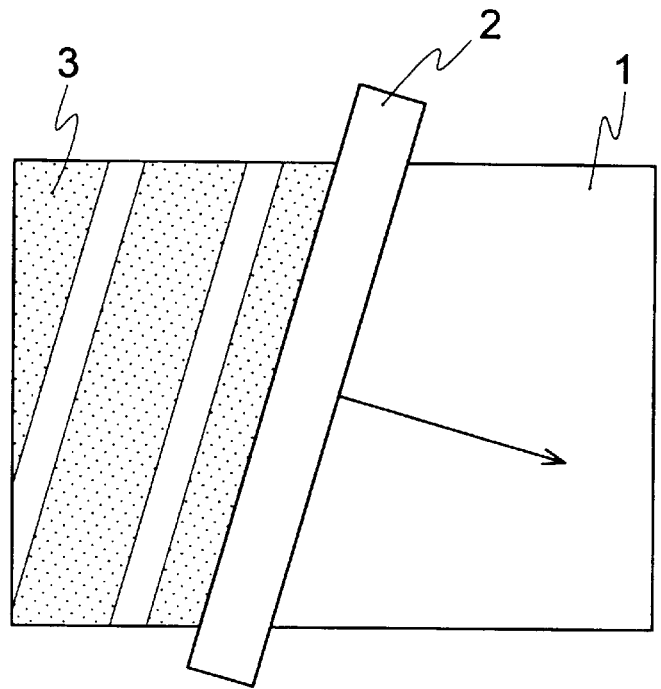
FIG. 3(a) and (b) is a diagram for explaining application of resin according to still another embodiment of the present invention.
Figure 3B:
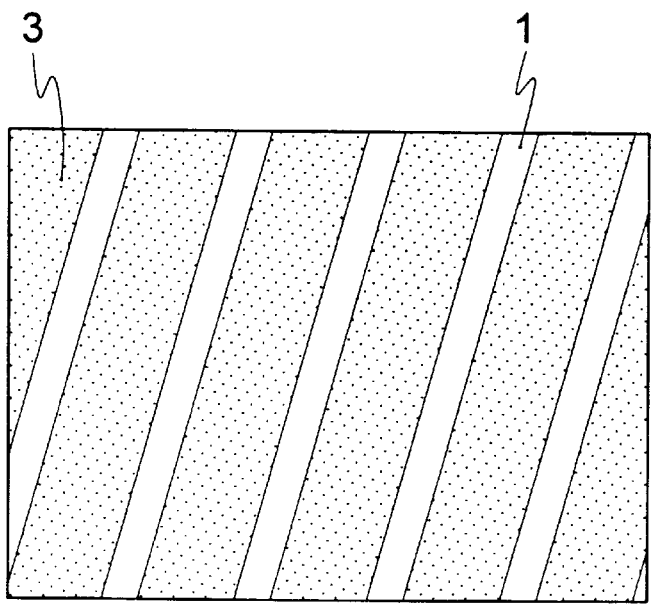

A manufacturing method of electron devices according to a third embodiment of the present invention will now be explained. FIG. 3 is a diagram for explaining application of resin according to still another embodiment of the present invention, wherein FIG. 3(a) is a diagram showing a condition in which a nozzle 2 is performing scanning while dropping resin, and FIG. 3(b) is a diagram showing a condition after the nozzle 2 has completed dropping resin. In the drawings, 1 denotes a substrate, 2 a nozzle, and 3 resist applied onto the substrate 1.

As shown in FIG. 3(a), the nozzle 2 is scanned while resist 3 is being dropped by the nozzle 2 onto the substrate 1. At this time, scanning is performed such that the scanning direction of the nozzle 2 is made to be oblique relative to the substrate 1, e.g. scanning is performed by fixing the substrate 1 at a position rotated by approximately 1 to 15 degrees. At the time of scanning, resin supply is controlled in a longitudinal direction of the substrate 1 so that resin is intermittently dropped. Care should be taken that dropping shall not be performed without dropping onto the center of the substrate. If the direction of inclination is identical with the rotating direction of the substrate after completion of dropping resin, the effect of improving the uniformity of applied film thickness can be made large.

According to the present embodiment, scanning is performed with the substrate 1 being rotated in a direction identical with the rotating direction of the substrate 1, e.g. with the substrate 1 being rotated by approximately 1 to 15 degrees in the scanning direction of the nozzle 2, and simultaneously, by controlling the resin supply at the time of scanning so that resin is intermittently dropped. With this arrangement, even in a case in which clogging of a part of the nozzle 2 has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods while the amount of droppings of resin used at the time of application can be further decreased by approximately 5% than compared to conventional methods.

Embodiment 4

Figure 4A:
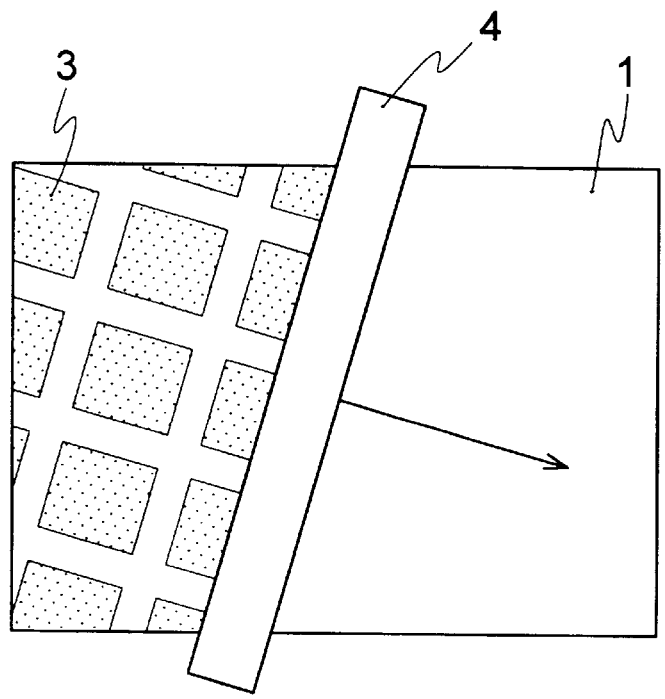
FIG. 4(a) and (b) is a diagram for explaining application of resin according to yet another embodiment of the present invention.
Figure 4B:
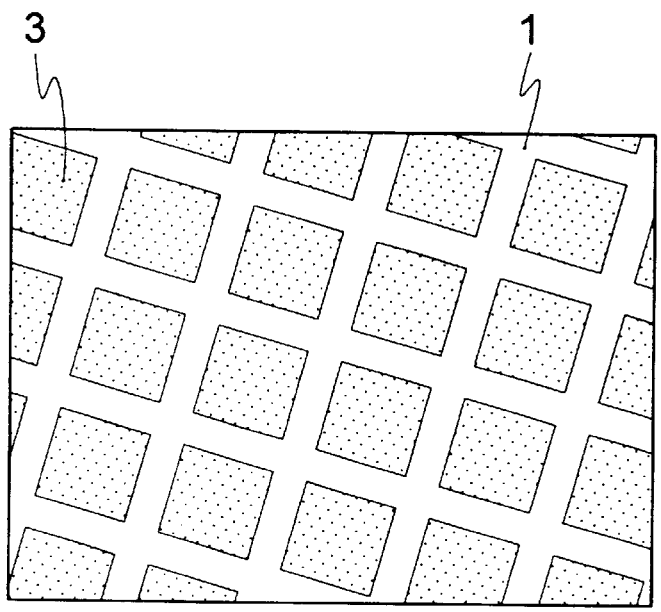

A manufacturing method of electron devices according to a fourth embodiment of the present invention will now be explained. FIG. 4 is a diagram for explaining application of resin according to still another embodiment of the present invention, wherein FIG. 4(a) is a diagram showing a condition in which a nozzle 4 is performing scanning while dropping resin, and FIG. 4(b) is a diagram showing a condition after the nozzle 4 has completed dropping resin. In the drawings, 1 denotes a substrate, 4 a nozzle having comb teeth-like outlets for enabling intermittent dropping in a width direction of the substrate, and 3 resist applied onto the substrate 1.

As shown in FIG. 4(a), scanning is performed while the resist 3 is dropped onto the substrate 1 through the comb teeth-like nozzle 4 for intermittently dropping the resist 3 in a width direction thereof. At this time, scanning is performed such that the scanning direction of the nozzle 2 is made to be oblique relative to the substrate 1, e.g. scanning is performed by fixing the substrate 1 at a position rotated by approximately 1 to 15 degrees. At the time of scanning, resin supply is controlled in a longitudinal direction of the substrate 1 so that resin is intermittently dropped. Care should be taken that dropping shall not be performed without dropping onto the center of the substrate. If the direction of inclination is identical with the rotating direction of the substrate after completion of dropping resin, the effect of improving the uniformity of applied film thickness can be made large.

According to the present embodiment, scanning is performed with the substrate 1 being rotated by approximately 1 to 15 degrees with respect to the scanning direction of the nozzle, and simultaneously, by controlling the resin supply at the time of scanning in terms of the width direction and longitudinal direction of the substrate 1 to perform intermittent dropping. With this arrangement, even in a case in which clogging of a part of the nozzle 2 has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods while the amount of droppings of resist used at the time of application can be further decreased by approximately 10% than compared to conventional methods.

It should be noted that the nozzle according to the present embodiment can be applied to the preceding Embodiments 1 to 3.

Embodiment 5

A manufacturing method of electron devices according to a fifth embodiment of the present invention will now be explained. FIG. 5 is a diagram for explaining application of resin according to yet another embodiment of the present invention, wherein FIGS. 5(b) to (e) show processes, i.e. slit dropping by the nozzle 2 or central dropping, completion of dropping by the dropping nozzle 5, rotation and oscillation. In the drawings, 1 denotes a substrate, 2 a slit-type dropping nozzle, 5 a dropping nozzle, and 3 resist applied onto the substrate 1.

Figure 5A:
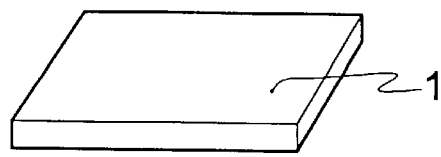
FIG. 5(a), (b), (c), (d) and (e) is a diagram for explaining application of resin according to yet another embodiment of the present invention.
Figure 5B:
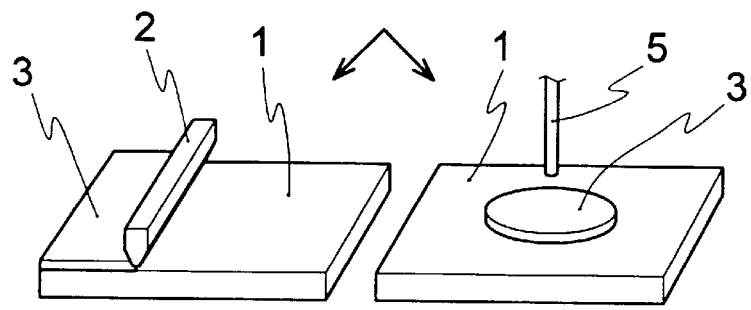
Figure 5C:
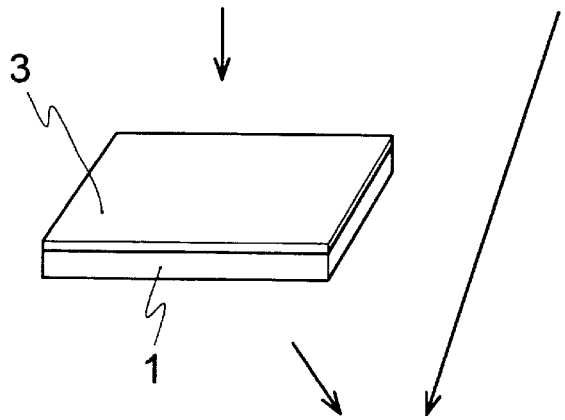
Figure 5D:
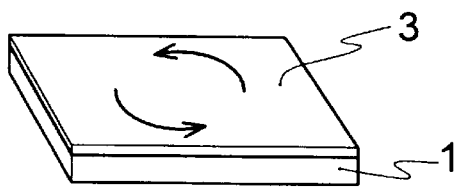
Figure 5E:
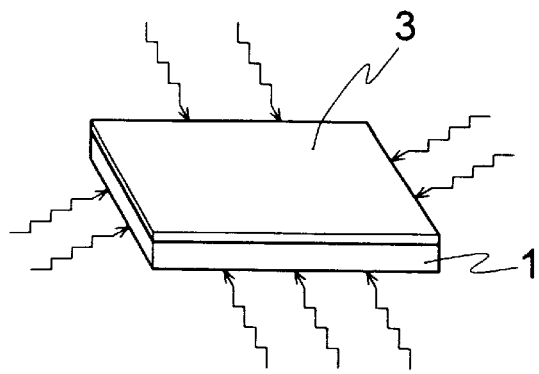

The resist 3 is dropped onto the substrate 1 by the nozzle 2 or dropping nozzle 5 (FIGS. 5(b) and (c)). Then, resist is uniformly applied over the whole substrate by rotating the substrate (FIG. 5(d)). It should be noted that the rotation of the substrate can be omitted in case sufficient uniformity has been obtained after dropping of the resin. Next, the substrate is oscillated by applying to the substrate stage an oscillating force of approximately 5 to 500 Hz in order to improve the uniformity of the applied resist and the flatness of concave/convex portions in underlying structure (FIG. 5(f)).

According to the present embodiment, by applying oscillating force to the substrate after application of resist, the flatness which is affected by irregular portions generated through the application or by unevenness in underlying surface can be improved, whereby an effect of decreasing resin required for the slit-type dropping method can be further increased.

It should be noted that applying oscillating force to the substrate as in the present embodiment might also be applied to the preceding Embodiments 1 to 4.

Embodiment 6

A manufacturing method of electron devices according to a sixth embodiment of the present invention will now be explained. FIG. 6 is a diagram for explaining application of resin according to yet another embodiment of the present invention, wherein FIGS. 6(b) to (e) respectively indicate conditions of processes for resin dropping, completion of dropping, rotation (uniformization) and light-baking. In the drawings, 1 denotes a substrate, 2 a nozzle, 6 photosensitive or non-photosensitive resin such as resist.

Figure 6A:
FIG. 6(a), (b), (c), (d) and (e) is a diagram for explaining application of resin according to yet another embodiment of the present invention.
Figure 6B:
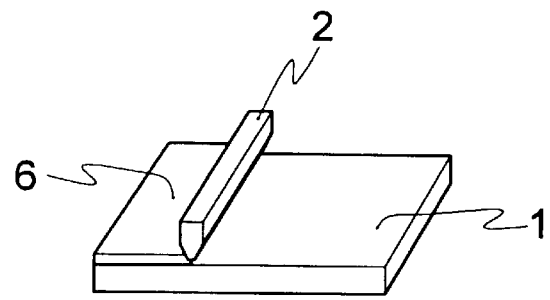
Figure 6C:
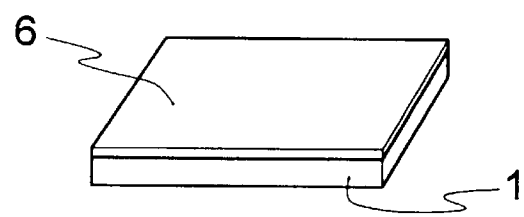
Figure 6D:
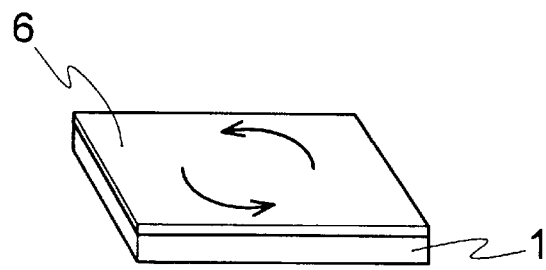
Figure 6E:
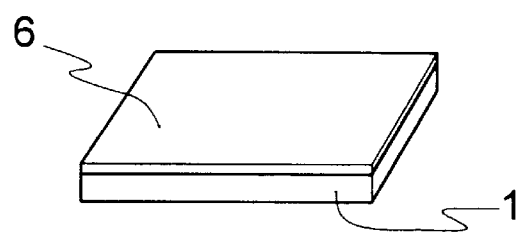
Figure 7A:
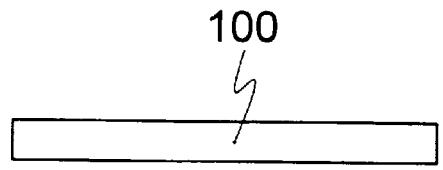
FIG. 7(a), (b), (c) and (d) is a diagram showing a conventional manufacturing process of an electron device.
Figure 7B:
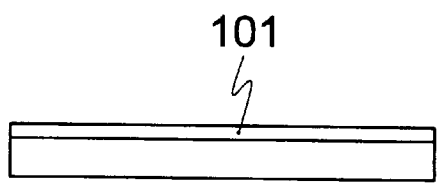
Figure 7C:
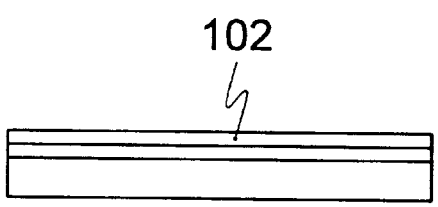
Figure 7D:
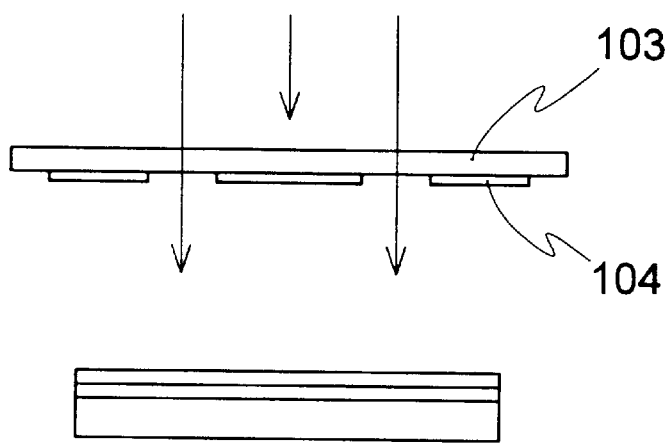
Figure 8A:
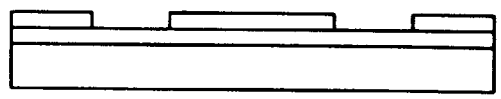
FIG. 8(a), (b) and (c) is a diagram showing a conventional manufacturing process of an electron device.
Figure 8B:
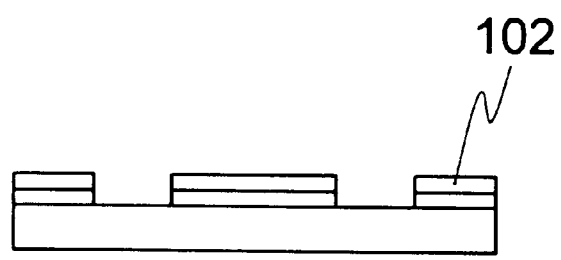
Figure 8C:
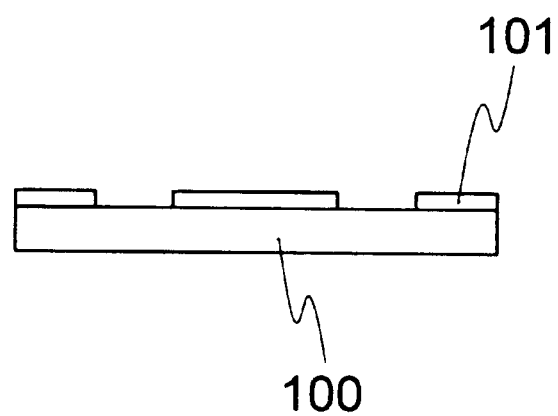
Figure 9A:
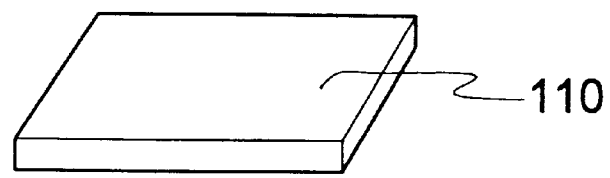
FIG. 9(a), (b) and (c) is a diagram showing a conventional resist application process.
Figure 9B:
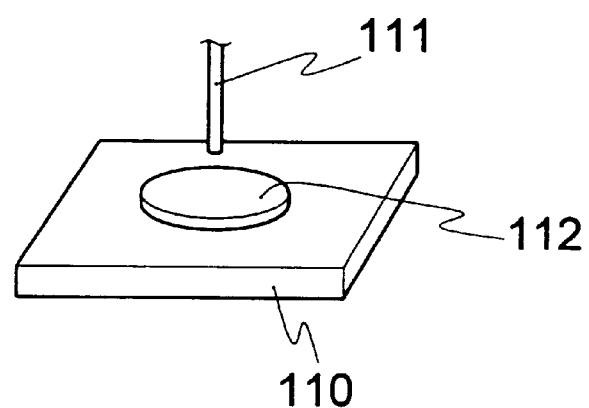
Figure 9C:
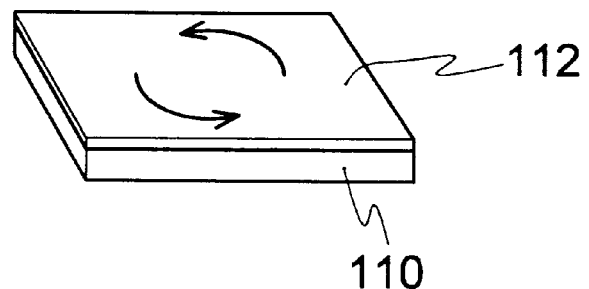
Figure 10A:
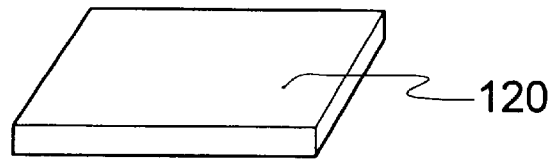
FIG. 10(a), (b), (c) and (d) is a diagram showing another conventional resist application process.
Figure 10B:
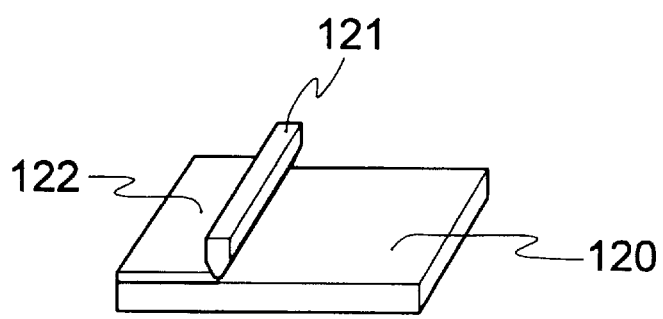
Figure 10C:
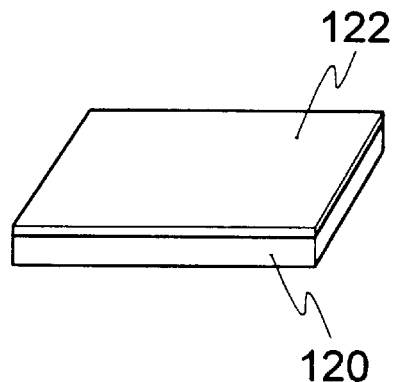
Figure 10D:
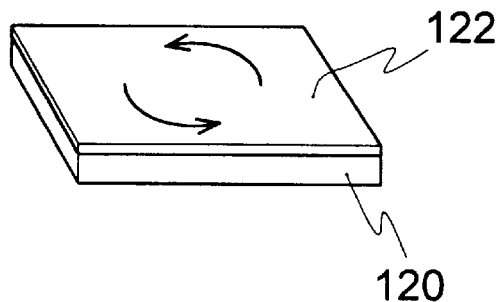
Figure 11A:
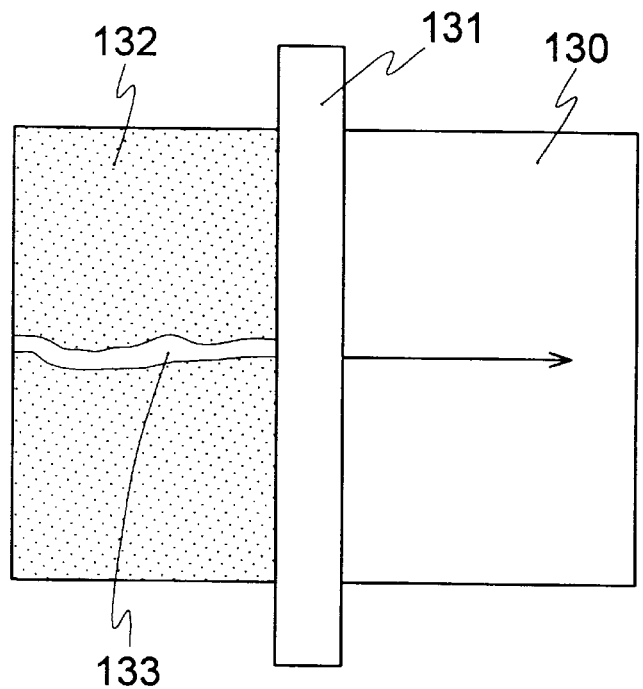
FIG. 11(a) and (b) is an explanatory diagram showing generation of a dropping irregular region by the slit dropping method.
Figure 11B:
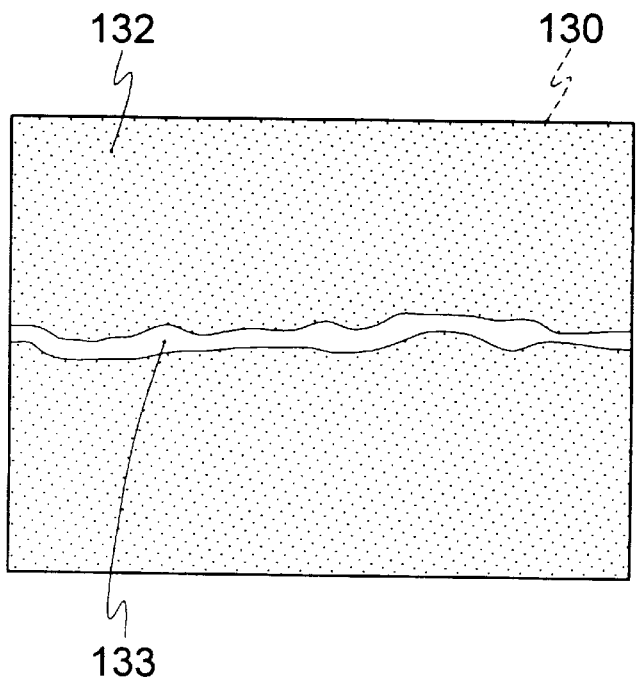

As shown in FIG. 6, by scanning the nozzle 2 in a parallel manner with respect to the substrate 1, the photosensitive or non-photosensitive 6 resin such as resist can be dropped and applied uniformly and also over the whole substrate (FIG. 6(b) and (c)), and thereafter, the substrate 1 is rotated to improve the uniformity of the applied film thickness (FIG. 6(d)). This rotating process might be omitted in case the targeted uniformity of film thickness can be obtained by the slit dropping alone. Then, baking is lightly performed at approximately 95° C. for approximately 30 seconds, and again, the nozzle 2 in scanned in a parallel manner with respect to the substrate 1, such that the photosensitive or non-photosensitive resin 6 such as resist is dropped and applied uniformly and also over the whole substrate (FIG. 6(b) and (c)), and thereafter, the substrate 1 is rotated to improve the uniformity of the applied film thickness (FIG. 6(d)). Similarly to the first time, this rotating process might be omitted in case the targeted uniformity of film thickness can be obtained by the slit dropping alone.

According to this embodiment, application of resin onto the substrate 1 is performed, e.g. twice and light baking is performed between these processes for the purpose of lightly removing solvents included in the resin. With this arrangement, the amount of used resin can be decreased in case a desired film thickness exceeds a range thereof that can be obtained by performing rotation of the substrate or controlling the resin dropping when application of resin is performed only once, and simultaneously, a desired film thickness can be obtained while ensuring uniformity.

Performing a plurality times of scanning as in the present embodiment might also be applied to the preceding Embodiments 1 to 5.

Embodiment 7

While the preceding embodiments 1, 2, 3, 4, 5 and 6 have been explained by taking cases in which positive-type resist is employed, these can also be applied to resin having photosensitive characteristics, to non-photo sensitive resin, or to inorganic film to be dropped and applied. Further, the substrate has been made to oscillate and rotate with respect to the nozzle in order to perform scanning by making the nozzle meander relative to the substrate in Embodiments 1, 2, 3 and 4, the same effects can be obtained in the present invention by making the nozzle meander and move with respect to the substrate. While the nozzle has been meandered relative to the substrate in Embodiment 2, the same effects can be obtained by making the nozzle move in a not-straight manner, e.g. in a zigzag pattern. Further, while light-baking has been performed at 95° C. and for 30 seconds in Embodiment 6, the baking conditions are not limited to this in the present invention and might be varied depending on the type of resin employed. While slit dropping has been performed in Embodiment 1 with the substrate being in a rotated condition by approximately 1 to 15 degrees with respect to the scanning direction of the nozzle and in a direction identical with the rotating direction of the substrate, scanning might also be performed in the reverse direction with respect to the rotating direction of the substrate although the effects become smaller. According to Embodiment 5, the substrate has been made to oscillate by applying oscillating force of approximately 5 to 500 Hz to the substrate stage, oscillation of even higher periods might also be applied, depending on the viscosity of the material to be dispersed.

It should be noted that the manufacturing method of the present invention might also be applied, besides to semiconductor devices, to manufacturing methods of display devices such as PDP (plasma display devices), or electron devices such as color filters or printed boards.

According to the first aspect of the present invention, the nozzle for performing resin dropping is scanned to apply resin while maintaining a scanning direction of the nozzle in an inclined condition at a specified angle relative to the substrate in a direction identical with the rotating direction of the substrate after application of the resin. With this arrangement, even in a case in which clogging of a part of the nozzle has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods without the necessity of increasing the amount of droppings of resist used at the time of application.

According to the second aspect of the present invention, the scanning direction of the slit-type dropping nozzle for performing resin dropping is set by making the substrate oscillate and rotate around a certain position at a specified period and oscillating angle so that the nozzle is relatively meandered and scanned with respect to the substrate to apply resin. With this arrangement, even in a case in which clogging of a part of the nozzle has occurred due to a foreign matter and dropping defect has occurred, the uniformity in film thickness will not be remarkably damaged unless the defect has occurred in the center of the substrate. Further, since the probability that such a defect in application occurs in the center of the substrate is much smaller than compared to the first aspect of the invention, generation of defects in pattern, display and characteristics owing to defects in uniformity of applied film thickness can be reduced than compared to conventional methods without the necessity of increasing the amount of droppings of resist used at the time of application.

According to the third aspect of the present invention, at the time of scanning the slit-type dropping nozzle for performing resin dropping, the nozzle intermittently drops resin in a scanning direction except onto a central portion of the substrate to apply resin. With this arrangement, even in a case in which clogging of a part of the nozzle has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods without the necessity of increasing the amount of droppings of resist used at the time of application.

According to the fourth aspect of the present invention, at the time of scanning the slit-type dropping nozzle, it is included a process wherein the nozzle intermittently drops resin in a scanning direction to apply resin. With this arrangement, even in a case in which clogging of a part of the nozzle has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods while the amount of droppings of resist used at the time of application can be further decreased by approximately 5% than compared to conventional methods.

According to the fifth aspect of the present invention, comb teeth-like outlets are formed at the slit-type dropping nozzle for performing resin dropping employed for application processes in which photosensitive or non-photosensitive resin is applied onto the substrate by the slit dropping method so that resin can be intermittently dropped in a width direction thereof, whereby the amount of used resin can be decreased.

According to the sixth aspect of the present invention, the slit-type dropping nozzle is employed for intermittently dropping resin with respect to a scanning width and a scanning direction except onto a central portion of the substrate to apply resin. With this arrangement even in a case in which clogging of a part of the nozzle has occurred due to a foreign matter and dropping defect has occurred, the uniformity in film thickness will not be remarkably damaged unless the defect has occurred in the center of the substrate. Further, since the probability that such a defect in application occurs in the center of the substrate is very small, generation of defects in pattern, display and characteristics owing to defects in uniformity of applied film thickness can be reduced than compared to conventional methods while the amount of droppings of resist used at the time of application can be further decreased by approximately 10% than compared to conventional methods.

According to the seventh aspect of the present invention, the substrate is either rotated after dropping, or maintained as it is and oscillated after performing application to improve uniformity of applied film thickness. With this arrangement, the flatness which is affected by irregular portions generated through the application or by unevenness in underlying surface can be improved, whereby an effect of decreasing resin required for the slit-type dropping method can be further increased.

According to the eighth aspect of the present invention, it is included, in the manufacturing methods according to the first, second or third aspect of the present invention, a process wherein the substrate is either rotated after dropping, or maintained as it is and oscillated after performing application to improve uniformity and flatness of applied film thickness. With this arrangement, the flatness which is affected by irregular portions generated through the application or by unevenness in underlying surface can be improved, whereby an effect of decreasing resin required for the slit-type dropping method can be further increased.

According to the ninth aspect of the present invention, resin is applied such that a plurality times of scanning of a slit-type dropping nozzle for performing resin dropping is performed in accordance with a desired film thickness. With this arrangement, the amount of used resin can be decreased in case a desired film thickness exceeds a range thereof which can be obtained by performing rotation of the substrate or controlling the resin dropping when application of resin is performed only once, and simultaneously, a desired film thickness can be obtained while ensuring uniformity.

According to the tenth aspect of the present invention, it is included, in the manufacturing method according to the first, second, third or seventh aspect of the present invention, a process wherein resin is applied such that a plurality of times of scanning of a slit-type dropping nozzle for performing resin dropping is performed in accordance with a desired film thickness. With this arrangement, the amount of used resin can be decreased in case a desired film thickness exceeds a range thereof which can be obtained by performing rotation of the substrate or controlling the resin dropping when application of resin is performed only once, and simultaneously, a desired film thickness can be obtained while ensuring uniformity.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A manufacturing method for electronic devices comprising:

applying photosensitive or non-photosensitive resin onto a substrate by a slit-type dropping nozzle method, including, scanning a slit-type dropping nozzle across the substrate to apply a resin layer onto the substrate, the slit-type dropping nozzle comprising a nozzle having a linear bottom portion for supplying the resin, and maintaining a scanning direction of the nozzle in an inclined condition relative to the substrate at a specified angle in a direction substantially the same as a rotating direction of the substrate after resin has been applied thereto.

2. The manufacturing method of claim 1, further comprising intermittently applying resin with the slit-type dropping nozzle in a scanning direction to apply the resin layer, at a time of scanning the slit-type dropping nozzle.

3. The manufacturing method of claim 1, further comprising providing the linear portion of the slit-type dropping nozzle with comb teeth-like outlets so that resin can be intermittently applied in a width direction of the nozzle for intermittently applying resin with respect to a scanning width and a scanning direction except onto a central portion of the substrate to apply the resin layer.

4. The manufacturing method of claim 1, further comprising one of:

rotating the substrate after the resin layer is applied, and maintaining the substrate in a current position and oscillating the substrate after the resin layer is applied, so as to improve uniformity of a thickness of the resin layer.

5. The manufacturing method of claim 1, further comprising scanning the slit-type dropping nozzle a plurality times over the substrate in accordance with a desired thickness of the resin layer.

6. A manufacturing method for electronic devices comprising:

applying photosensitive or non-photosensitive resin onto a substrate by a slit-type dropping nozzle method, including, setting a scanning direction of a slit-type dropping nozzle by making the substrate oscillate and rotate around a certain position at a specified period and oscillating angle so that the nozzle is relatively meandered and scanned with respect to the substrate to apply a resin layer to the substrate, the slit-type dropping nozzle comprising a nozzle having a linear bottom portion for supplying the resin.

7. The manufacturing method of claim 6, further comprising intermittently applying resin with the slit-type dropping nozzle in a scanning direction to apply the resin layer, at a time of scanning the slit-type dropping nozzle.

8. The manufacturing method of claim 6, further comprising providing the linear portion of the slit-type dropping nozzle with comb teeth-like outlets so that resin can be intermittently applied in a width direction of the nozzle for intermittently applying resin with respect to a scanning width and a scanning direction except onto a central portion of the substrate to apply the resin layer.

9. The manufacturing method of claim 6, further comprising one of:

rotating the substrate after the resin layer is applied, and maintaining the substrate in a current position and oscillating the substrate after the resin layer is applied, so as to improve uniformity of a thickness of the resin layer.

10. The manufacturing method of claim 6, further comprising scanning the slit-type dropping nozzle a plurality of times over the substrate in accordance with a desired thickness of the resin layer.

* * * * *